(12) United States Patent
Samie et al.

(10) Patent No.: US 11,728,535 B2
(45) Date of Patent: Aug. 15, 2023

(54) BATTERY MODULE HOUSING COOLING ASSEMBLY

(71) Applicant: GM Global Technology Operations LLC, Detroit, MI (US)

(72) Inventors: Farzad Samie, Franklin, MI (US); Anthony Michael Coppola, Rochester Hills, MI (US); Jian Gao, Auburn Hills, MI (US); Derek Frei Lahr, Howell, MI (US); Velmurugan Ayyanar, Pondicherry (IN); SeungHwan Keum, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 147 days.

(21) Appl. No.: 17/375,753

(22) Filed: Jul. 14, 2021

(65) Prior Publication Data
US 2023/0017290 A1  Jan. 19, 2023

(51) Int. Cl.
| | |
|---|---|
| *H01M 10/6556* | (2014.01) |
| *H05K 7/20* | (2006.01) |
| *H01M 10/0525* | (2010.01) |
| *H01M 10/613* | (2014.01) |
| *H01M 10/653* | (2014.01) |
| *H01M 50/204* | (2021.01) |
| *H01M 50/249* | (2021.01) |
| *H01M 10/625* | (2014.01) |

(52) U.S. Cl.
CPC ... *H01M 10/6556* (2015.04); *H01M 10/0525* (2013.01); *H01M 10/613* (2015.04); *H01M 10/625* (2015.04); *H01M 10/653* (2015.04); *H01M 50/204* (2021.01); *H01M 50/249* (2021.01); *H05K 7/20254* (2013.01); *H01M 2220/20* (2013.01)

(58) Field of Classification Search
CPC .......... H01M 10/0525; H01M 10/613; H01M 10/625; H01M 10/653; H01M 10/6556; H01M 2220/20; H01M 50/204; H01M 50/249; H05K 7/20254
See application file for complete search history.

(56) References Cited

U.S. PATENT DOCUMENTS

2019/0097281 A1\* 3/2019 Kustosch .............. F28D 15/046

\* cited by examiner

*Primary Examiner* — Victoria H Lynch
(74) *Attorney, Agent, or Firm* — Vivacqua Crane PLLC

(57) ABSTRACT

According to several aspects of the present disclosure, a battery module housing cooling assembly is disclosed. The battery module housing cooling assembly can include an endwall including a first polymer plate and a second polymer plate that define a slot therebetween. At least one of the first polymer plate or the second polymer plate define a channel therein that is configured to receive a coolant fluid, and the slot is configured to receive an electrical connector. The battery module housing cooling assembly can also include a cooling plate defining a first connection port and a second connection port, wherein the first connection port and a second connection port are configured to provide the coolant fluid to the channel.

20 Claims, 5 Drawing Sheets

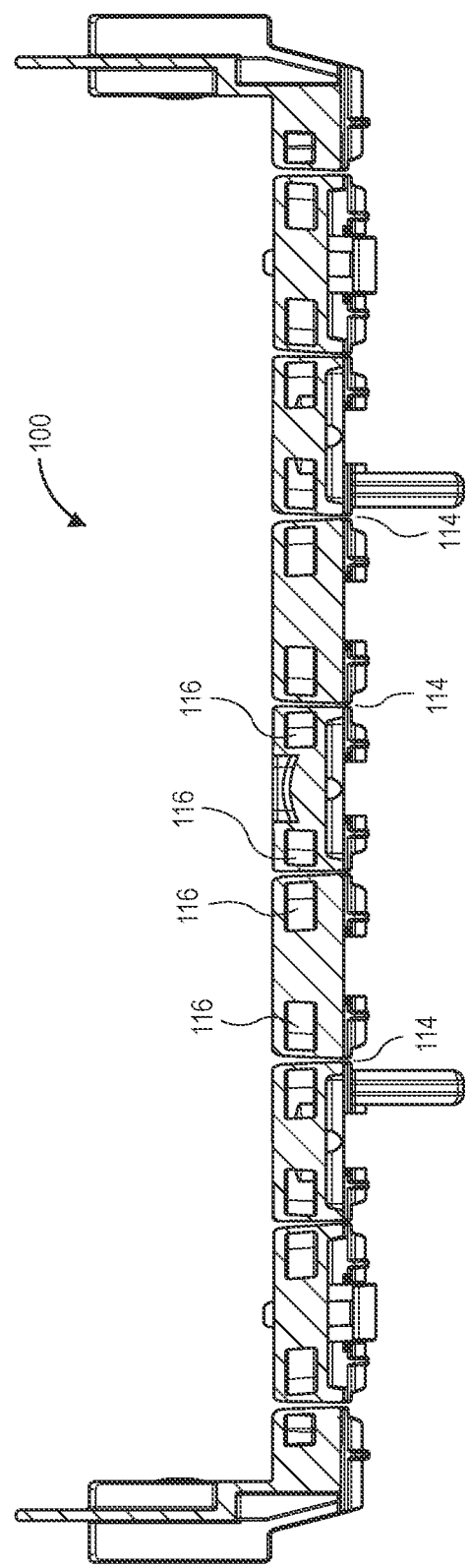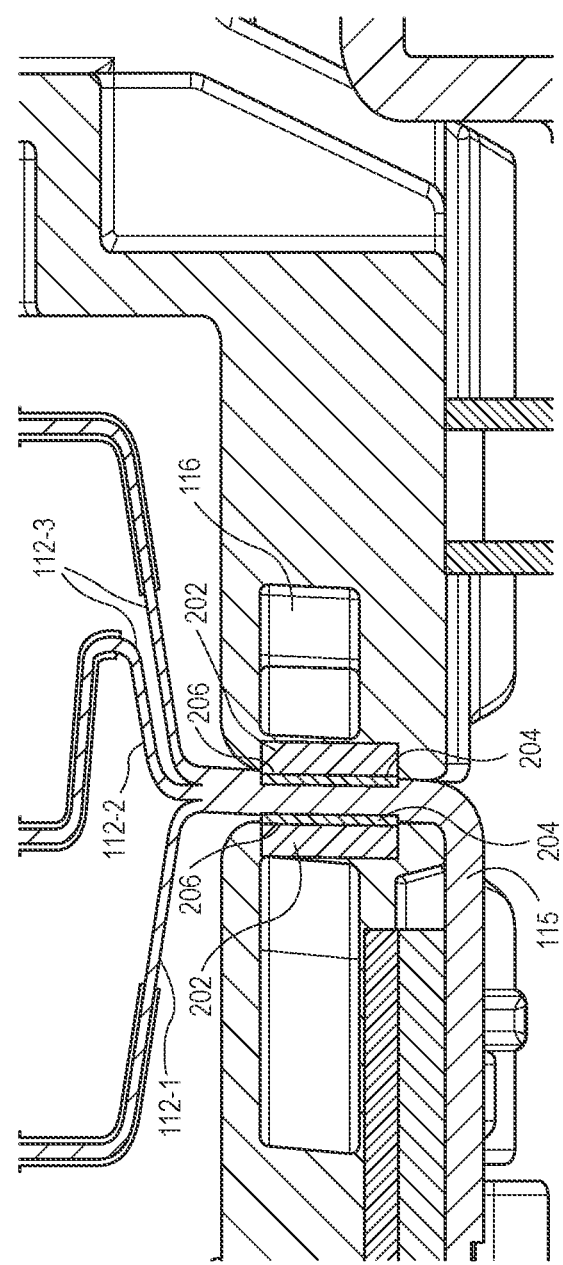

BATTERY MODULE HOUSING COOLING ASSEMBLY

INTRODUCTION

The present disclosure relates to electric storage systems employing rechargeable batteries. More specifically, aspects of this disclosure relate to a battery module housing cooling assembly that is configured to remove heat from a battery's electrical connection tab.

Most commercially available hybrid electric and full electric vehicles (collectively "electric-drive vehicles") employ a rechargeable traction battery pack to store and supply the requisite power for operating the powertrain's motor/generator unit(s). In order to generate tractive power with sufficient vehicle range, a traction battery pack is significantly larger, more powerful, and higher in capacity than a standard 12-volt starting, lighting, and ignition (SLI) battery. Contemporary traction battery packs (also referred to as "electric vehicle battery" or "EVB") group discrete stacks of battery cells into individual battery modules that are mounted onto the vehicle chassis, e.g., via a battery housing or support tray.

Stacked electrochemical battery cells are connected in series or parallel through use of an electrical interconnect board (ICB). Some vehicle battery systems employ multiple independently-operable, high-voltage battery packs to provide higher voltage delivery and greater system capacity through increased amp-hours. A dedicated Battery Pack Control Module (BPCM), through collaborative operation with a Powertrain Control Module (PCM), regulates the opening and closing of battery pack contactors to govern which pack or packs will power the vehicle's traction motor(s) at a given time.

SUMMARY

According to several aspects of the present disclosure, a battery module housing cooling assembly is disclosed. The battery module housing cooling assembly can include an endwall including a first polymer plate and a second polymer plate that define a slot therebetween. At least one of the first polymer plate or the second polymer plate define a channel therein that is configured to receive a coolant fluid, and the slot is configured to receive an electrical connector. The battery module housing cooling assembly can also include a cooling plate defining a first connection port and a second connection port, wherein the first connection port and a second connection port are configured to provide the coolant fluid to the channel.

In other features, the cooling plate defines a plurality of channels that are configured to receive the coolant fluid.

In other features, a surface of the first polymer plate is in thermal contact with the electrical connector within the slot.

In other features, a surface of the second polymer plate is in thermal contact with the electrical connector within the slot.

In other features, the battery module housing cooling assembly includes a thermal interface disposed over the surface of the dielectric thermally conductive insert.

In other features, the thermal interface comprises a thermal interface paste.

In other features, the dielectric thermally conductive insert comprises a thermally conductive polymeric material.

According to several aspects of the present disclosure, a battery module housing cooling assembly is disclosed. The battery module housing cooling assembly can include an endwall including a first polymer plate and a second polymer plate that define a slot therebetween. At least one of the first polymer plate or the second polymer plate define a channel therein that is configured to receive a coolant fluid, and the slot is configured to receive an electrical connector. The battery module housing cooling assembly can also include a cooling plate defining a first connection port and a second connection port, wherein the first connection port and a second connection port are configured to provide the coolant fluid to the channel. The cooling plate also defines a plurality of channels that are configured to receive the coolant fluid.

In other features, a surface of the first polymer plate is in thermal contact with the electrical connector within the slot.

In other features, a surface of the second polymer plate is in thermal contact with the electrical connector within the slot.

In other features, the battery module housing cooling assembly includes a thermal interface disposed over the surface of the dielectric thermally conductive insert.

In other features, the thermal interface comprises a thermal interface paste.

In other features, the dielectric thermally conductive insert comprises a thermally conductive polymeric material.

According to several aspects of the present disclosure, a battery module housing cooling assembly is disclosed. The battery module housing cooling assembly can include an endwall including a first polymer plate and a second polymer plate that define a slot therebetween. At least one of the first polymer plate or the second polymer plate define a channel therein that is configured to receive a coolant fluid, and the slot is configured to receive an electrical connector. A surface of the first polymer plate is in thermal contact with the electrical connector within the slot. The battery module housing cooling assembly can also include a cooling plate defining a first connection port and a second connection port, wherein the first connection port and a second connection port are configured to provide the coolant fluid to the channel. The cooling plate also defines a plurality of channels that are configured to receive the coolant fluid.

In other features, a surface of the second polymer plate is in thermal contact with the electrical connector within the slot.

In other features, the battery module housing cooling assembly includes a thermal interface disposed over the surface of the dielectric thermally conductive insert.

In other features, the thermal interface comprises a thermal interface paste.

BRIEF DESCRIPTION OF THE DRAWINGS

The drawings described herein are for illustration purposes only and are not intended to limit the scope of the present disclosure in any way.

FIG. 3 is another partial plan view of the battery module housing cooling assembly in accordance with aspects of the present disclosure;

FIG. 4 is another partial plan view of the battery module housing cooling assembly in accordance with aspects of the present disclosure;

DETAILED DESCRIPTION

The following description is merely exemplary in nature and is not intended to limit the present disclosure, application, or uses.

Figure 1:
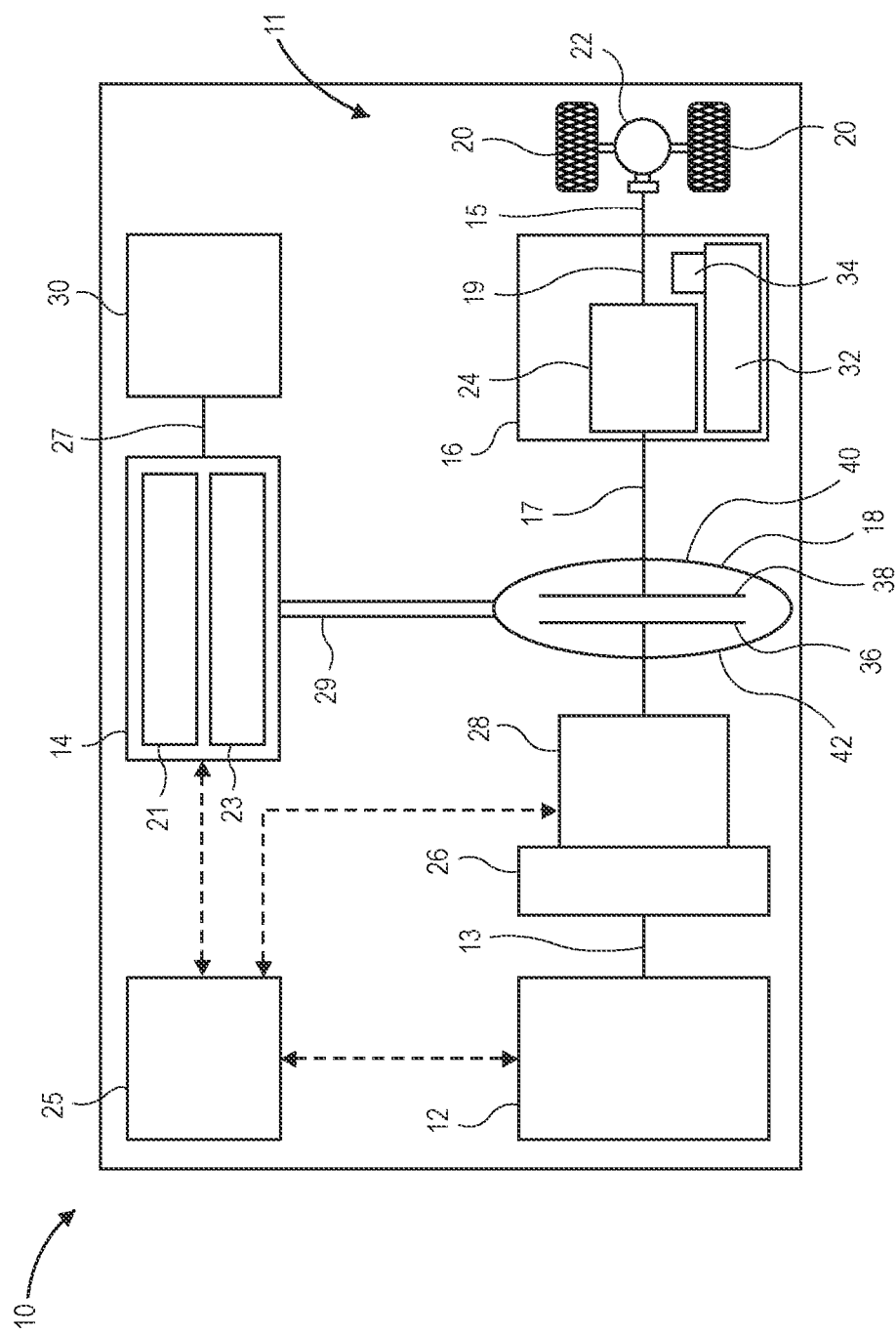
FIG. 1 a schematic illustration of a representative electric-drive motor vehicle with a hybrid powertrain having an electric traction motor powered by a rechargeable traction battery pack and drivingly connected to a final drive system via a multi-speed power transmission in accordance with aspects of the present disclosure.

FIG. 1 illustrates an example vehicle 10 according to an example implementation. The vehicle 10 may comprise a passenger vehicle with a parallel two-clutch (P2) hybrid-electric powertrain. In particular, the illustrated powertrain is generally composed of a single engine 12 and a single motor 14 that operate, individually and in concert, to transmit tractive power to a multi-speed power transmission 16 through a hydrokinetic torque converter (TC) assembly 18 to drive one or more road wheels 20 of the vehicle's final drive system 11. It is understood that the description of the vehicle 10 is merely an exemplary application with which novel aspects and features of this disclosure can be practiced. In the same vein, implementation of the present concepts into a hybrid electric powertrain should also be appreciated as an exemplary application of the novel concepts disclosed herein. As such, it will be understood that aspects and features of the present disclosure can be applied to other vehicle powertrain architectures, incorporated into any logically relevant type of motor vehicle, and utilized for both automotive and non-automotive applications alike. Lastly, only select components have been shown and will be described in additional detail herein. Nevertheless, the vehicles, powertrains, and battery systems discussed below may include numerous additional and/or alternative features, and other available peripheral components, for carrying out the various methods and functions of this disclosure.

The vehicle 10 includes a powertrain system, which is represented herein by an internal combustion engine (ICE) assembly 12 and an electric motor/generator unit 14, that is drivingly connected to a driveshaft 15 of a final drive system 11 by a multi-speed automatic power transmission 16. The engine 12 transfers power, preferably by way of torque via an engine crankshaft 13 ("engine output member"), to an input side of the transmission 16. According to the illustrated example, the ICE assembly 12 rotates an engine-driven torsional damper assembly 26 and, through the torsional damper assembly 26, an engine disconnect device 28. This engine disconnect device 28, when operatively engaged, transmits torque received from the ICE assembly 12 by way of the damper 26 to input structure of the TC assembly 18. As the name implies, the engine disconnect device 28 may be selectively disengaged to drivingly disconnect the engine 12 from the motor 14 and the transmission 16.

The transmission 16, in turn, is adapted to receive, selectively manipulate, and distribute tractive power from the engine 12 and motor 14 to the vehicle's final drive system 11—represented herein by a driveshaft 15, rear differential 22, and a pair of rear road wheels 20—and thereby propel the hybrid vehicle 10. The power transmission 16 and torque converter 18 of FIG. 1 may share a common transmission oil pan 32 for supply of hydraulic fluid. A shared transmission pump 34 provides sufficient hydraulic pressure for the fluid to selectively activate the elements of the transmission 16, the TC assembly 18 and, for some implementations, the engine disconnect device 28. It may be preferable, for at least some embodiments, that the engine disconnect device 28 comprise an active clutching mechanism, such as a controller-actuated selectable one-way clutch (SOWC) or friction-plate clutch, or a passive clutching mechanism, such as a ratchet-and-pawl or sprag-type freewheel OWC assembly.

The ICE assembly 12 operates to propel the vehicle 10 independently of the electric traction motor 14, e.g., in an "engine-only" operating mode, or in cooperation with the motor 14, e.g., in a "motor-boost" operating mode. In the example depicted in FIG. 1, the ICE assembly 12 may be any available or hereafter developed engine, such as a compression-ignited diesel engine or a spark-ignited gasoline or flex-fuel engine, which is readily adapted to provide its available power output typically at a number of revolutions per minute (RPM). Although not explicitly portrayed in FIG. 1, it should be appreciated that the final drive system 11 may take on any available configuration, including front wheel drive (FWD) layouts, rear wheel drive (RWD) layouts, four-wheel drive (4WD) layouts, all-wheel drive (AWD) layouts, six-by-four (6×4) layouts, etc.

FIG. 1 also depicts an electric motor/generator unit 14 or other suitable traction motor that operatively connects via a motor support hub, shaft, or belt 29 ("motor output member") to torque converter 18, and via torque converter 18 to an input shaft 17 ("transmission input member") of the transmission 16. The motor/generator unit 14 may be directly coupled to a TC input shaft or drivingly mounted to a housing portion of the torque converter 18. The electric motor/generator unit 14 is composed of an annular stator 21 circumscribing and concentric with a rotor 23. Electric power is provided to the stator 21 through electrical conductors or cables 27 that pass through the motor housing via suitable sealing and insulating feedthroughs (not illustrated). Conversely, electric power may be provided from the MGU 14 to an onboard traction battery pack 30, e.g., through regenerative braking. Operation of any of the illustrated powertrain components may be governed by an onboard or remote vehicle controller, such as programmable electronic control unit (ECU) 25. While shown as a P2 hybrid-electric architecture with a single motor in parallel power-flow communication with a single engine assembly, the vehicle 10 may employ other powertrain configurations, including P0, P1, P2.5, P3 and P4 hybrid powertrains, any of which may be adapted for an REV, PHEV, range-extended hybrid vehicle, fuel-cell hybrid vehicle, etc.

Power transmission 16 may use differential gearing 24 to achieve selectively variable torque and speed ratios between transmission input and output shafts 17 and 19, respectively, e.g., while sending all or a fraction of its power through the variable elements. One form of differential gearing is the epicyclic planetary gear arrangement. Planetary gearing offers the advantage of compactness and different torque and speed ratios among all members of the planetary gearing subset. Traditionally, hydraulically actuated torque establishing devices, such as clutches and brakes (the term "clutch" used to reference both clutches and brakes), are selectively engageable to activate the aforementioned gear elements for establishing desired forward and reverse speed ratios between the transmission's input and output shafts 17, 19. While envisioned as an 8-speed automatic transmission, the power transmission 16 may optionally take on other suitable configurations, including Continuously Variable Transmission (CVT) architectures, automated-manual transmissions, etc.

As indicated above, ECU 25 is constructed and programmed to govern, among other things, operation of the engine 12, motor 14, transmission 16, TC 18, and disconnect device 28. Control module, module, controller, control unit, electronic control unit, processor, and any permutations thereof, may be used interchangeably and synonymously to mean any one or various combinations of one or more of logic circuits, combinational logic circuit(s), Application Specific Integrated Circuit(s) (ASIC), electronic circuit(s), central processing unit(s) (e.g., microprocessor(s)), input/output circuit(s) and devices, appropriate signal conditioning and buffer circuitry, and other components to provide the described functionality, etc. Associated memory and storage (e.g., read only, programmable read only, random access, hard drive, tangible, etc.)), whether resident, remote or a combination of both, store processor-executable software and/or firmware programs or routines.

Software, firmware, programs, instructions, routines, code, algorithms, and similar terms may be used interchangeably and synonymously to mean any processor-executable instruction sets, including calibrations and look-up tables. The ECU 25 may be designed with a set of control routines executed to provide desired functions. Control routines are executed, such as by a central processing unit, and are operable to monitor inputs from sensing devices and other networked control modules, and execute control and diagnostic routines to govern operation of devices and actuators. Such inputs may include vehicle speed and acceleration data, speed limit data, traffic light status and location data, road gradient data, stop sign location data, traffic flow data, geospatial data, road and lane-level data, vehicle dynamics data, sensor data, etc. Routines may be executed in real-time, continuously, systematically, sporadically and/or at regular intervals, for example, each 100 microseconds, 3.125, 6.25, 12.5, 25 and 100 milliseconds, etc., during vehicle use or operation. Alternatively, routines may be executed in response to occurrence of an event during operation of the vehicle 10.

A hydrokinetic torque converter assembly 18 of FIG. 1 operates as a fluid coupling for operatively connecting the engine 12 and motor 14 with the internal epicyclic gearing 24 of the power transmission 16. Disposed within an internal fluid chamber of the torque converter assembly 18 is a bladed impeller 36 juxtaposed with a bladed turbine 38. The impeller 36 is situated in serial power-flow fluid communication with the turbine 38, with a stator (not shown) interposed between the impeller 36 and turbine 38 to selectively alter fluid flow therebetween. The transfer of torque from the engine and motor output members 13, 29 to the transmission 16 via the TC assembly 18 is through stirring excitation of hydraulic fluid, such as transmission oil, inside the TC's internal fluid chamber caused by rotation of the turbine and impeller blades 36, 38. To protect these components, the torque converter assembly 18 is constructed with a TC pump housing, defined principally by a transmission-side pump shell 40 fixedly attached, e.g., via electron beam welding, MIG or MAG welding, laser welding, and the like, to an engine-side pump cover 42 such that a working hydraulic fluid chamber is formed therebetween.

Figure 2:
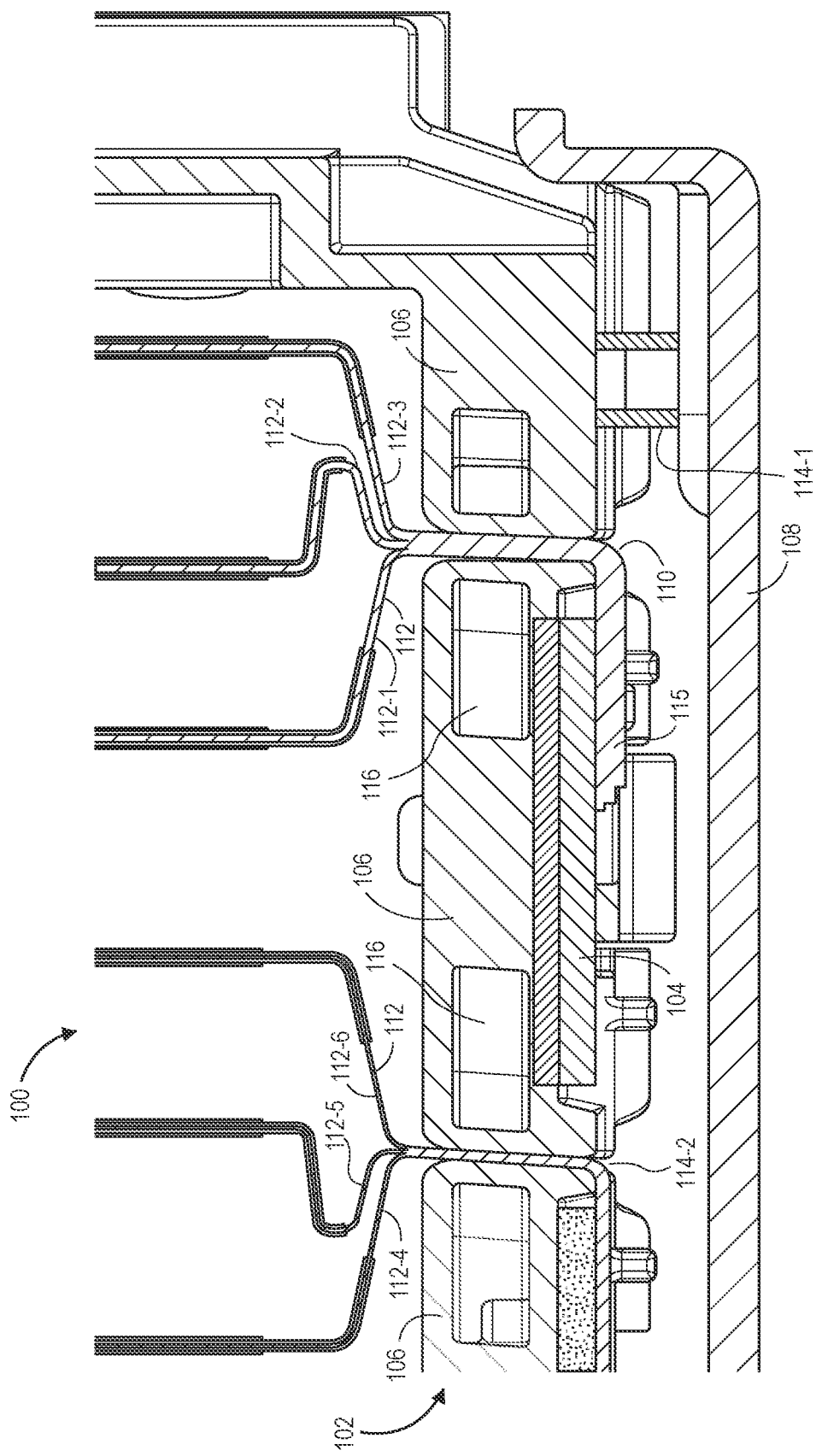
FIG. 2 is a partial plan view of battery module housing cooling assembly in accordance with aspects of the present disclosure.

FIGS. 2 through 6 illustrate a battery module housing cooling assembly 100 according to an example implementation of the present disclosure. The battery module housing cooling assembly 100 is configured to retain one or more battery modules, e.g., multiple batteries stacked side-by-side, of a traction battery pack 30. As shown in FIG. 2, the battery module housing cooling assembly 100 includes an enclosure 102, a busbar 104, one or more polymer plates 106, and an end plate 108. The end plate 108 can be connected to at least one polymer plate 106 via a connector 110, and the enclosure 102 can include, in part, the one or more polymer plates 106 comprise endwalls to retain the battery modules of the traction battery pack 30. While not illustrated, it is understood that the enclosure can further include sidewalls that project orthogonally from a base. The polymer plates 106 may comprise any suitable polymer material. For example, the polymer material may comprise polyethylene (PE), polypropylene (PP), polystyrene (PS), polyvinyl chloride (PVC), phenolics, or phenol formaldehyde (PF). For example, the polymer material may comprise a thermoplastic, a thermoset plastic, or the like.

According to an example configuration, the traction battery pack 30 is generally composed of an array of lithium-ion battery modules. These battery modules are arranged in a pattern of rows and columns, and buttressed on a battery support tray (not shown) that provides subjacent support for the battery packs during vehicle operation. Aspects of the disclosed concepts may be similarly applicable to other electric storage unit architectures, including those employing nickel metal hydride (NiMH) batteries, lead acid batteries, lithium polymer batteries, or other applicable type of rechargeable electric vehicle battery (EVB). Each battery module may include a series of electrochemical battery cells, such as pouch-type lithium ion (Li-ion) or Li-ion polymer battery cells, for example. The array of lithium-ion battery modules may be aligned and electrically interconnected using an integrated interconnect board (ICB) assembly.

The busbar 104 can be electrically connected to one or more batteries of the traction battery pack 30 via one or more electrically conductive tabs 112. Depending on the configuration of the conductive tabs 112, the electrically conductive tabs 112 can comprise at least one of a positive electrode or a negative electrode of the batteries. FIG. 2 illustrates electrically conductive tabs 112-1 through 112-6 and, each electrically conductive tab 112 can connect to at least one battery of the traction battery pack 30. In an example implementation, the electrically conductive tabs 112-1 through 112-3 are connected in parallel and connect to the busbar 104. While each of the tabs 112 may have the same dimensions and rectangular shape, they may also be varied in dimensions and shape from edge to edge.

Depending on the configuration of the connector types, e.g., positive or negative, the tabs 112 may be welded together and appropriately capped or sheathed to form a plurality of electrical connectors. The electrical connectors may be connected to other electrical conduits with the same polarity, such as bus bars, circuitry, or may themselves form terminals for external connection to a load and power source. For example, certain examples of formation of the electrical connectors may include using a one-step ultrasonic welding to weld the electrode tab foil with external terminals (e.g., outside tabs for forming the final cell). Alternatively, ultrasonic welding can be first used to weld the electrode tab foil, and then use ultrasonic welding to weld foil with external terminals. In another example, ultrasonic welding can be used to weld the electrode tab foil first, and then laser and/or resistance welding can be used to weld foil with external terminals. In certain aspects, an external terminal material for a positive electrode comprises aluminum, by way of example.

A first polymer plate 106-1 and a second polymer plate 106-2 can define a first slot 114-1 therebetween. The second polymer plate 106-2 and a third polymer plate 106-3 can define a second slot 114-2 therebetween. As shown, the first polymer plate 106-1 and the second polymer plate 106-2 are arranged such that the first slot 114-1 allows the electrically conductive tabs 112-1 through 112-3 to pass through to allow a first end 115 of the electrically conductive tabs connect to the busbar 104. Similarly, the second polymer plate 106-2 and the third polymer plate 106-3 are arranged such that the second slot 114-2 allows the electrically conductive tabs 112-4 through 112-6 to pass through to allow a first end 118 of the electrically conductive tabs connect to another busbar (not shown).

As shown in FIG. 2, surfaces of the first polymer plate 106-1 and the second polymer plate 106-2 are in thermal contact with the electrically conductive tabs 112-1 through 112-3 to allow heat transfer from the electrically conductive tabs 112-1 through 112-3 to the polymer plates 106. For example, a surface of the first polymer plate 106-1 may be in direct contact with a portion of the electrically conductive tab 112-1 that passes through the first slot 114-1. Similarly, a surface of the second polymer plate 106-2 may be in direct contact with a portion of the electrically conductive tab 112-3 that passes through the first slot 114-1.

As shown in FIGS. 2 and 3, the polymer plates 106 can each include a channel 116 defined therein. The channels 116 can be in thermal contact with one or more connection ports of a cooling plate, which is discussed in greater detail below. The channels 116 can define a pathway within the respective polymer plates 106 between an inlet connection port and an outlet connection port. The channels 116 may allow for a coolant fluid to pass through the channels 116 between the connection ports due to a pressure differential. Heat from the polymer plates 106 can be transferred to the coolant fluid, which decreases the temperature of the polymer plates 106. In various implementations, the coolant fluid refers to a liquid, a liquid mixture, a gas, a gas mixture, or a mixture of liquids and gases.

In an example implementation, as shown in FIG. 4, the polymer plates 106 can include dielectric thermally conductive inserts 202 and a thermal interface 204. The dielectric thermally conductive inserts 202 can be oriented such that at least one surface 206 is positioned along the slot 114. The thermal interface 204 can comprise a suitable thermal interface paste that is applied to the surface 206. Additionally or alternatively, the thermal interface paste may also be applied behind the bus bars so that the bus bar and the plastic plate are in thermal communication, which can provide an additional thermal path. The thermal interface 204 and the dielectric thermally conductive insert 202 can provide additional heat transfer characteristics such that more heat is transferred to the polymer plate 106 with respect to a polymer plate 106 not including the thermal interface 204 and the dielectric thermally conductive insert 202. In an example implementation, the dielectric thermally conductive insert 202 can comprise a suitable thermally conductive polymeric material. In some instances, the thermal interface paste allows for some movement in an electrical connector tab, which provides an ability to cool a flexible electrical connector tab.

Figure 5:
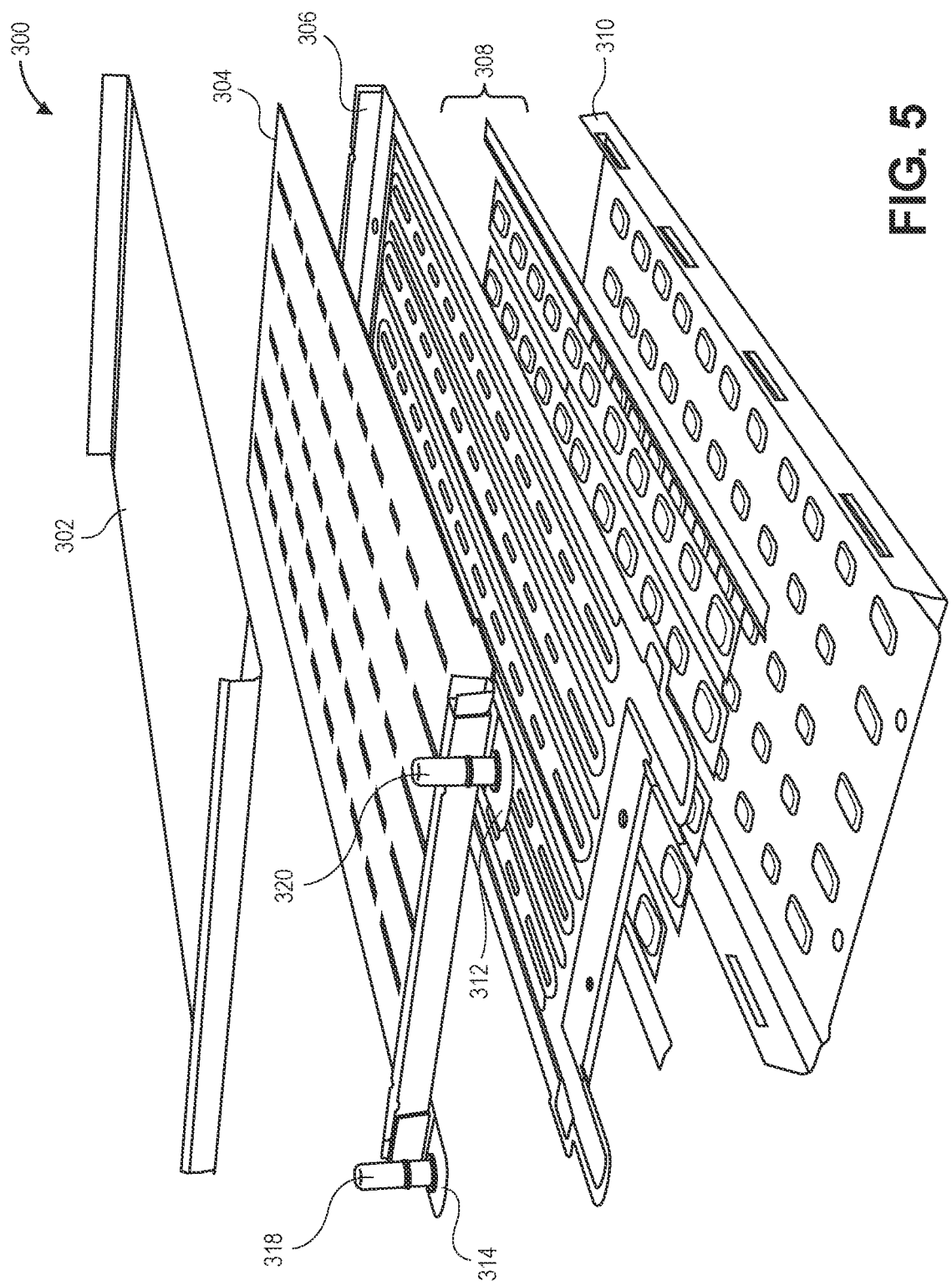
FIG. 5 is an elevated isometric view of a cooling plate of the battery module housing cooling assembly in accordance with aspects of the present disclosure.
Figure 6:
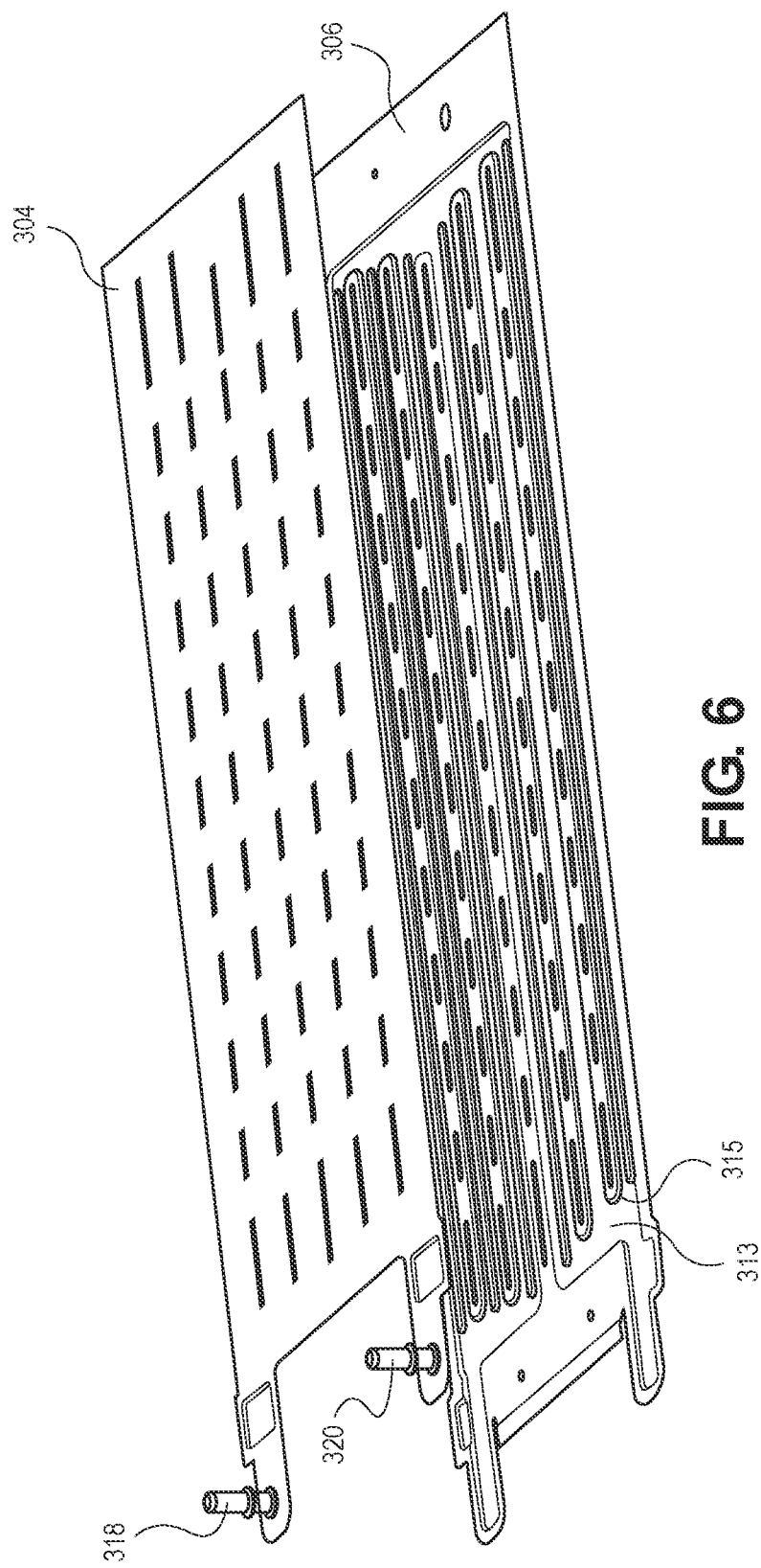
FIG. 6 is a plan view of a cooling plate of the battery module housing cooling assembly in accordance with aspects of the present disclosure.

Referring to FIGS. 5 and 6, a cooling plate assembly 300 can be mounted underneath the stacked battery cells, seated generally flush against the bottom surface of the enclosure 102 base, to selectively transfer heat out of the battery module housing cooling assembly 100. As shown, the cooling plate assembly 300 includes an insulation layer 302, a top plate 304, a bottom plate 306, a carrier structure 308, and a carrier 310. The top plate 304 comprises a structure that is proximal to the traction battery pack 30, and the bottom plate 306 comprises a structure that is distal to the traction battery pack 30 relative to the top plate 304.

Generally, the top plate 304 and the bottom plate 306 form a cooling plate that provides cooling functionality to the battery module housing cooling assembly 100. The top plate 304 and the bottom plate 306 are configured to interface with one another when to form a coolant flow channel form a space therebetween. The space formed between the top plate 304 and the bottom plate 306 define a coolant flow channel 311 that comprises an area in which coolant flow can circulate. In one or more implementations, as shown in FIG. 6, the bottom plate 306 defines a recessed area 313 and a protruding area 315, e.g., an elevated area as compared with the recessed area 313. Taken together, the recessed area 313 and the protruding area 315 can form the coolant flow channel 311 when the top plate 304 engages with the bottom plate 306.

As shown in FIGS. 5 and 6, the top plate 304 can further include a first flange 312 and a second flange 314 that extends outwardly from the top plate 304. Each flange 312, 314 can include a respective coolant, i.e., connection, port 318, 320 that extends from a surface of the flanges 312, 314. In an example implementation, the first coolant port 318 can be connected to a coolant reservoir that provides coolant to the first coolant port 318.

The first coolant port 318 can introduce the coolant to the coolant flow channel, and the coolant can exit the second coolant port 320. For example, a pressure differential between the coolant ports 318, 320 can cause the coolant to flow from the first coolant port 318, e.g., an inlet port, to the second coolant port 320, e.g., an outlet port, via the coolant flow channel. While the coolant port 318 is referenced as the inlet port and the coolant port 320 is referenced as the outlet port, it is understood that the coolant ports 318, 320 can be interchangeable for providing inlet and outlet functionality.

While shown with a generally rectangular-polyhedron shape, it is envisioned that the battery module housing cooling assembly 100 may take on other desired sizes and shapes to accommodate alternative applications with different packaging and design constraints. In the same vein, the battery module housing cooling assembly 100 may be assembled from greater or fewer segments than that which are shown in the drawings. For example, suitable molding techniques may be employed to form multiple segments that can be thermally or vibrationally welded together. In other examples, a sacrificial template of the channels 116 may be manufactured from a suitable soluble, combustible, or thermal degradable material. The polymer plate 106 may be overmolded over the template using a suitable polymer material.

As used herein, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle, when the vehicle is operatively oriented on a horizontal driving surface.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A battery module housing cooling assembly, comprising:
   an endwall comprising a first polymer plate and a second polymer plate that define a slot therebetween, wherein at least one of the first polymer plate or the second polymer plate define a channel therein that is configured to receive a coolant fluid and the slot is configured to receive an electrical connector, wherein a surface of the second polymer plate is in thermal contact with the electrical connector within the slot; and
   a cooling plate defining a first connection port and a second connection port, wherein the first connection port and a second connection port are configured to provide the coolant fluid to the channel.

2. The battery module housing cooling assembly of claim 1, wherein the cooling plate defines a plurality of channels that are configured to receive the coolant fluid.

3. The battery module housing cooling assembly of claim 1, wherein a surface of the first polymer plate is in thermal contact with the electrical connector within the slot.

4. The battery module housing cooling assembly of claim 1, further comprising a dielectric thermally conductive insert oriented so that a surface of the dielectric thermally conductive insert is in thermal contact with the electrical connector within the slot.

5. The battery module housing cooling assembly of claim 4, further comprising a thermal interface disposed over the surface of the dielectric thermally conductive insert.

6. The battery module housing cooling assembly of claim 5, wherein the thermal interface comprises a thermal interface paste.

7. The battery module housing cooling assembly of claim 4, wherein the dielectric thermally conductive insert comprises a thermally conductive polymeric material.

8. The battery module housing cooling assembly of claim 1, wherein the first polymer plate and the second polymer plate is comprised of a polymer material selected from the group consisting of polyethylene (PE), polypropylene (PP), polystyrene (PS), polyvinyl chloride (PVC), phenolics, and phenol formaldehyde (PF).

9. A battery module housing cooling assembly, comprising: an endwall comprising a first polymer plate and a second polymer plate that define a slot therebetween, wherein at least one of the first polymer plate or the second polymer plate define a channel therein that is configured to receive a coolant fluid and the slot is configured to receive an electrical connector; a cooling plate defining a first connection port and a second connection port, wherein the first connection port and the second connection port are configured to provide the coolant fluid to the channel, wherein the cooling plate defines a plurality of channels that are configured to receive the coolant fluid; and a dielectric thermally conductive insert oriented so that a surface of the dielectric thermally conductive insert is in thermal contact with the electrical connector within the slot.

10. The battery module housing cooling assembly of claim 9, wherein a surface of the first polymer plate is in thermal contact with the electrical connector within the slot.

11. The battery module housing cooling assembly of claim 9, wherein a surface of the second polymer plate is in thermal contact with the electrical connector within the slot.

12. The battery module housing cooling assembly of claim 9, further comprising a thermal interface disposed over the surface of the dielectric thermally conductive insert.

13. The battery module housing cooling assembly of claim 12, wherein the thermal interface comprises a thermal interface paste.

14. The battery module housing cooling assembly of claim 9, wherein the dielectric thermally conductive insert comprises a thermally conductive polymeric material.

15. The battery module housing cooling assembly of claim 9, wherein the first polymer plate and the second polymer plate is comprised of a polymer material selected from the group consisting of polyethylene (PE), polypropylene (PP), polystyrene (PS), polyvinyl chloride (PVC), phenolics, and phenol formaldehyde (PF).

16. A battery module housing cooling assembly, comprising: an endwall comprising a first polymer plate and a second polymer plate that define a slot therebetween, wherein at least one of the first polymer plate or the second polymer plate define a channel therein that is configured to receive a coolant fluid and the slot is configured to receive an electrical connector, wherein a surface of the first polymer plate is in thermal contact with the electrical connector within the slot; and a cooling plate defining a first connection port and a second connection port, wherein the first connection port and the second connection port are configured to provide the coolant fluid to the channel, wherein the cooling plate defines a plurality of channels that are configured to receive the coolant fluid.

17. The battery module housing cooling assembly of claim 16, wherein a surface of the second polymer plate is in thermal contact with the electrical connector within the slot.

18. The battery module housing cooling assembly of claim 16, further comprising a dielectric thermally conductive insert oriented so that a surface of the dielectric thermally conductive insert is in thermal contact with the electrical connector within the slot.

19. The battery module housing cooling assembly of claim 18, further comprising a thermal interface disposed over the surface of the dielectric thermally conductive insert.

20. The battery module housing cooling assembly of claim 19, wherein the thermal interface comprises a thermal interface paste.

* * * * *